US012684781B2

(12) United States Patent
Zhao et al.

(10) Patent No.: US 12,684,781 B2
(45) Date of Patent: Jul. 14, 2026

(54) FERROELECTRIC MEMORY DEVICE WITH MULTI-LEVEL BIT CELL

(71) Applicant: GlobalFoundries U.S. Inc., Malta, NY (US)

(72) Inventors: Zhixing Zhao, Dresden (DE); Dominik M. Kleimaier, Dresden (DE); Stefan Duenkel, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 502 days.

(21) Appl. No.: 18/172,027

(22) Filed: Feb. 21, 2023

(65) Prior Publication Data

US 2024/0284680 A1 Aug. 22, 2024

(51) Int. Cl.
  *H10B 51/30* (2023.01)
  *G11C 11/22* (2006.01)
  *H10D 30/69* (2025.01)
(52) U.S. Cl.
  CPC .......... *H10B 51/30* (2023.02); *G11C 11/2275* (2013.01); *H10D 30/701* (2025.01)
(58) Field of Classification Search
  CPC ... H10B 51/30; H10D 30/701; G11C 11/2275
  See application file for complete search history.

(56) References Cited

U.S. PATENT DOCUMENTS

| | | | |
|---|---|---|---|
| 2004/0057274 A1* | 3/2004 | Dimmler | H10D 30/701 |
| | | | 257/E29.272 |
| 2006/0081901 A1 | 4/2006 | Arimoto et al. | |
| 2011/0182102 A1 | 7/2011 | Minami | |
| 2019/0296122 A1 | 9/2019 | Ino et al. | |
| 2021/0398580 A1 | 12/2021 | Yuh | |

FOREIGN PATENT DOCUMENTS

CN    113193047 A    7/2021

OTHER PUBLICATIONS

EP Search Report from related matter EP23201754.1 dated Mar. 26, 2024.

(Continued)

*Primary Examiner* — Richard A Booth

(57) ABSTRACT

A ferroelectric memory device includes a substrate including a source region and a drain region, and a gate structure disposed over the substrate. The gate structure includes a gate electrode including a plurality of electrode portions arranged in a first direction parallel to a top surface of the substrate, an oxide layer including a plurality of oxide portions corresponding respectively to the plurality of electrode portions, and a ferroelectric layer disposed between the gate electrode and the oxide layer along a second direction perpendicular to the first direction and including a plurality of ferroelectric portions corresponding respectively to the plurality of oxide portions. A least one of the plurality of oxide portions and at least one of the plurality of ferroelectric portions have different thicknesses along the second direction.

19 Claims, 5 Drawing Sheets

(56) References Cited

OTHER PUBLICATIONS

Ankit Dixit et al., "Extraction of performance parameters of nanoscale SOI LDD-FinFET using a semi-analytical model of capacitance and channel potential for low-power applications" Sep. 12, 2020, pp. 1-14, 126:782, Applied Physics A, Materials Science and Processing.

Der-Gao Lin et al., "A novel LDMOS structure with a step gate oxide", Dec. 10-13, 1995, pp. 963-966, IEEE, Proceedings of International Electron Devices Meeting, Washington, DC, USA.

Navjeet Bagga et al., "Cleaved-Gate Ferroelectric FET for Reliable Multi-Level Cell Storage", Mar. 27-31, 2022, pp. p. 5-1-p. 5-5, 2022 IEEE International Reliability Physics Symposium (IRPS), Dallas, TX, USA.

Karine Florent et al., "From planar to vertical capacitors: A step towards ferroelectric V-FeFET integration" 2017, op. 164-167, Sep. 11-14, 2017, IEEE, 47th European Solid-State Device Research Conference (ESSDERC), Leuven, Belgium.

S. Dunkel et al., "A FeFET based super-low-power ultra-fast embedded NVM technology for 22nm FDSOI and beyond", Dec. 2-6, 2017, pp. 19.7.1-19.7.4, 2017 IEEE International Electron Devices Meeting (IEDM), San Francisco, CA, USA.

EP Search Report from related matter EP23201754.1 dated Jul. 17, 2024.

Kim et al., "Comparison of writing methods of single memory cell with volatile and nonvolatile memory functions", Applied Physics Express, vol. 10, No. 6, May 25, 2017, pp. 064201-1 to 064201-4, DOI:10.7567/APEX.10.064201.

European Communication from related EP Application No. 23201754.1 mailed Apr. 17, 2026.

* cited by examiner

| Combination | Tox,left | Tferro,left | Tox,right | Tferro,right |
|---|---|---|---|---|
| 1 | Thin | Thin/thick (left=right) | Thick | Thin/thick (left=right) |
| 2 | Thick | Thin/thick (left=right) | Thin | Thin/thick (left=right) |
| 3 | Thin | Thin | Thick | Thick |
| 4 | Thin | Thick | Thick | Thin |
| 5 | Thin/thick (left=right) | Thin | Thin/thick (left=right) | Thick |
| 6 | Thin/thick (left=right) | Thick | Thin/thick (left=right) | Thin |

| State(s) | Left device | Right device |
|----------|-------------|--------------|
| State 1 | D | D |
| State 2 | D | U |
| State 3 | U | D |
| State 4 | U | U |

| | Curve 1 | | Curve 2 | | Curve 3 | | Curve 4 | |
|---|---|---|---|---|---|---|---|---|
| | D | D | D | U | U | D | U | U |
| Sensed current | High++ | | High | | Low | | Low-- | |
| Binary state | 00 | | 01 | | 10 | | 11 | |

FERROELECTRIC MEMORY DEVICE WITH MULTI-LEVEL BIT CELL

BACKGROUND

The present disclosure relates to a ferroelectric memory device having a multi-level bit cell, in particular a field effect transistor having a step dielectric structure.

Memory devices are trending toward high integration and high capacity. To implement the high capacity, a great number of memory cells are embedded in a memory device. Typically, as the number of memory cells in a memory device increases, its size also increases which in turn increases the manufacturing costs. To minimize the manufacturing costs while increasing the storage capacity, a memory device with a multi-level bit cell that is capable of storing more than a single bit of information has been introduced.

SUMMARY

Embodiments of the present disclosure are directed to a ferroelectric memory device having a multi-level bit cell, in particular a field effect transistor having a step dielectric structure.

In an embodiment, a ferroelectric memory device may include a substrate including a source region and a drain region, and a gate structure disposed over the substrate, wherein the gate structure includes a gate electrode including a plurality of electrode portions arranged in a first direction parallel to a top surface of the substrate, an oxide layer including a plurality of oxide portions corresponding respectively to the plurality of electrode portions, and a ferroelectric layer disposed between the gate electrode and the oxide layer along a second direction perpendicular to the first direction and including a plurality of ferroelectric portions corresponding respectively to the plurality of oxide portions, wherein at least one of the plurality of oxide portions and at least one of the plurality of ferroelectric portions have different thicknesses along the second direction.

In another embodiment, a method of operating a ferroelectric memory device may include in order to write a first state, applying a supply voltage to a gate structure of a ferroelectric field effect transistor (FeFET) and applying a ground voltage to a drain region and a source region, in order to write a second state, applying the supply voltage to the drain region and the source region and applying the ground voltage to the gate structure, and applying a low voltage that is lower than the supply voltage to the gate structure and applying the ground voltage to the drain region and the source region, in order to write a third state, applying the supply voltage to the gate structure and applying the ground voltage to the drain region and the source region, and applying the low voltage to the drain region and the source region and applying the ground voltage to the gate structure, and in order to write a fourth state, applying the supply voltage to the drain region and the source region and applying the ground voltage to the gate structure.

In another embodiment, a memory device includes a ferroelectric field effect transistor (FeFET), and the FeFET may include an oxide layer provided over a substrate, the oxide layer including a first oxide portion and a second oxide portion, a ferroelectric layer provided over the oxide layer, the ferroelectric layer including a first ferroelectric portion and a second ferroelectric portion, and a gate electrode provided over the ferroelectric layer, the gate electrode including a first gate portion and a second gate portion, wherein the first gate portion, the first ferroelectric portion, and the first oxide portion define a first storage device that is configured to store 1-bit data, and wherein the second gate portion, the second ferroelectric portion, and the second oxide portion define a second storage device that is configured to store 1-bit data.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figures 1, 2:
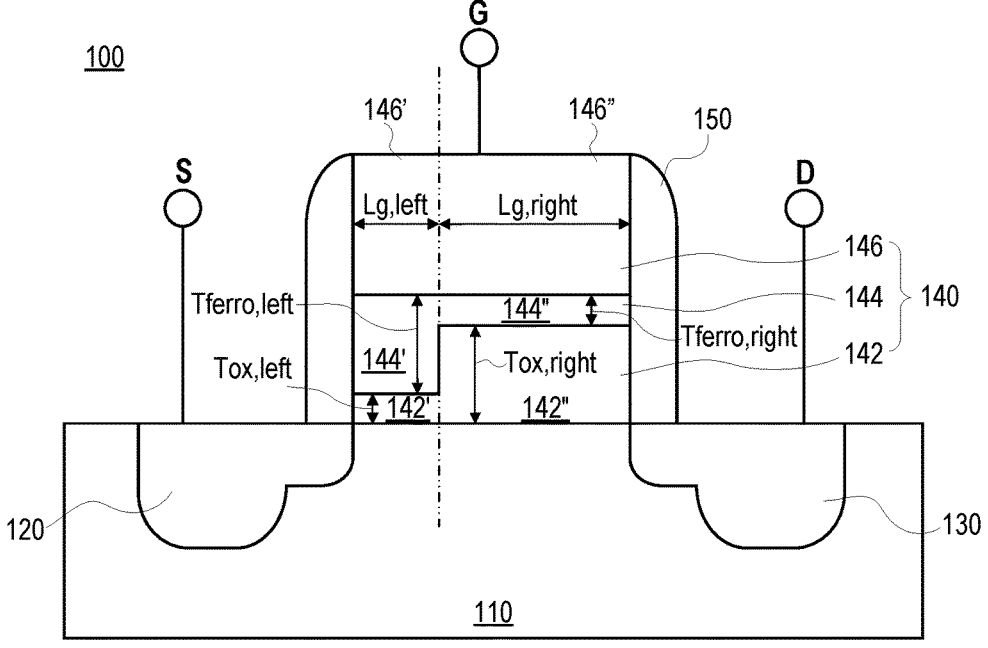
FIG. 1 illustrates a multi-level ferroelectric field effect transistor in a memory device according to an embodiment of the present disclosure.
FIG. 2 illustrates different combinations of a step oxide layer and a step ferroelectric layer according to embodiments of the present disclosure.

Exemplary embodiments of the present disclosure will be described below in more detail with reference to the accompanying drawings. The inventive features may, however, be embodied in different forms and should not be construed as limited to the embodiments set forth herein. Rather, these embodiments are provided so that this disclosure will disclose thorough and complete, and will fully convey the scope of the present claims to those skilled in the art. Throughout the disclosure, like reference numerals refer to like parts throughout the various figures and embodiments.

It will be understood that, although the terms "first" and/or "second" may be used herein to describe various elements, these elements should not be limited by these terms. These terms are only used to distinguish one element from another element for illustrative purposes. For instance, a first element discussed below could be termed a second element without departing from the teachings of the present disclosure. Similarly, the second element could also be termed the first element.

The drawings are not necessarily to scale and in some instances, proportions may have been exaggerated in order to clearly illustrate features of the embodiments. When a first element is referred to as being "on" a second element or "on" a substrate, it not only refers to a case where the first element is formed directly on the second element or the substrate but also a case where a third element exists between the first element and the second element or the substrate.

An element "connected" or "coupled" to or with another element may be directly connected or coupled to or with the other element or, instead, one or more intervening elements may be present. An element in "contact" with another element may be directly on or in direct contact with the other element or, instead, one or more intervening elements may be present.

FIG. 1 illustrates a multi-level ferroelectric field effect transistor (FeFET) 100 in a memory device according to an embodiment of the present disclosure. The multi-level FeFET 100 stores multi-bit data, e.g., 2-bit data. In another embodiment, an inventive multi-level FeFET stores 3-bit or more data. The multi-level FeFET 100 may be any of an N-type FeFET and a P-type FeFET.

The FeFET 100 includes a source region 120 and a drain region 130 that are disposed in a substrate 110. The FeFET 100 further includes a gate structure 140 that is disposed over the substate 110 between the source region 120 and the drain region 130. A spacer 150 is disposed on sidewalls of the gate structure 140. The spacer 150 includes two adjacent portions (e.g., first and second portions), where each portion is on first and second sidewalls of the gate structure 140. The source region 120 is coupled to a source terminal S, the drain region 130 is coupled to a drain terminal D, and the gate structure 140 is coupled to a gate terminal G.

The gate structure 140 includes a dielectric layer 142 (e.g., an oxide layer), a ferroelectric layer 144, and a gate electrode 146 that are sequentially stacked over the substrate 110 defining a channel region. The channel region is disposed below the gate structure 140 and between the source region 120 and the drain region 130. In an embodiment, the first portion of the spacer 150 is proximate the source region 120, and the second portion of the spacer 150 is proximate the drain region 130, so that the channel region is also defined between the first and second portions of the spacer 150. In an embodiment, the ferroelectric layer 144 includes a material that can be electrically polarized and reversed by the application of an external electric field, as will be explained in more detail subsequently. According to implementation, the ferroelectric layer 144 includes ferroelectric hafnium oxide, hafnium zirconium oxide, lead zirconate titanate, lead lanthanum zirconate titanate, or another ferroelectric material.

The gate electrode 146 includes a plurality of electrode portions, e.g., a left electrode portion 146' and a right electrode portion 146". The ferroelectric layer 144 includes a plurality of ferroelectric portions, e.g., a left ferroelectric portion 144' and a right ferroelectric portion 144", which correspond respectively to the plurality of electrode portions. The oxide layer 142 includes a plurality of oxide portions, e.g., a left oxide portion 142' and a right oxide portion 142", which correspond respectively to the plurality of ferroelectric portions. In an embodiment, the dielectric layer 142 (or oxide layer 142) includes high-k material, e.g., hafnium dioxide or zirconium dioxide.

In an embodiment, the left and right electrode portions 146' and 146" have substantially coplanar upper surfaces. The left electrode portion 146' has a first length $L_{g,left}$, and the right electrode portion 146" has a second length $L_{g,right}$. The left electrode portion 146' and the right electrode portion 146" may have different lengths. For example, the first length $L_{g,left}$ may be shorter than the second length $L_{g,right}$. In an embodiment, the left electrode portion 146', the left ferroelectric portion 144' and the left oxide portion 142' have substantially the same length, and the right electrode portion 146", the right ferroelectric portion 144", and the right oxide portion 142" have substantially the same length.

In an embodiment, the left and right ferroelectric portions 144' and 144" have different thicknesses, and the ferroelectric layer 144 is referred to as a "step ferroelectric layer." In an embodiment, the left ferroelectric portion 144' has a thickness $T_{ferro,left}$ greater than a thickness $T_{ferro,right}$ of the right ferroelectric portion 144".

In an embodiment, the left and right oxide portions 142' and 142" have different thicknesses, and the oxide layer 142 is referred to as a "step oxide layer." In an embodiment, the right oxide portion 142" has a thickness $T_{ox,right}$ greater than a thickness $T_{ox,left}$ of the left oxide portion 142'. The oxide layer 142 may include a thin oxide (e.g., single oxide), a medium thick oxide (e.g., median thick oxide), or a thick oxide, The thick oxide may be about three times the thickness of the thin oxide. The medium thick oxide may be about twice the thickness of the thin oxide.

The step oxide layer 142 and the step ferroelectric layer 144 together provide a dielectric structure having a step shape and may be referred to as "a step dielectric structure."

In FIG. 1, the gate structure 140 includes a plurality of gate structures, e.g., a left gate portion and a right gate portion that are each configured to store at 1-bit data. The left gate portion includes the left electrode portion 146', the left ferroelectric portion 144', and the left oxide portion 142'. The right gate portion includes the right electrode portion 146", the right ferroelectric portion 144", and the right oxide portion 142".

In an embodiment, the multi-level FeFET 100 includes a first storage device (or left device) and a second storage device (or right device), each of which is configured to store 1-bit data, so that the multi-level FeFET 100 is configured to store 2-bit data. The first storage device and the second storage device are associated with the left gate portion and the right gate portion, respectively. In another embodiment, the inventive FeFET has three or more gate portions and is configured to store 3-bit or more bit data, and its step dielectric structure has two or more steps.

FIG. 2 illustrates different combinations of a step oxide layer and a step ferroelectric layer included in a multi-level FeFET according to embodiments of the present disclosure. In this embodiment, the multi-level FeFET may store 2-bit data, and thus the multi-level FeFET may be implemented with one of six combinations illustrated in FIG. 2. However, embodiments are not limited thereto.

When the multi-level FeFET stores more than 2-bit data, the step oxide layer may include more than 2 oxide portions and the step ferroelectric layer may include more than 2 ferroelectric portions. Therefore, the number of combinations of the step oxide layer and the step ferroelectric layer may increase depending on the number of bits stored in the multi-level FeFET. In another embodiment, the multi-level FeFET may have a configuration corresponding to one of more than 6 combinations of the step oxide layer and the step ferroelectric layer.

Referring to FIG. 2, the multi-level FeFET may have a configuration corresponding to one of the six combinations of the step oxide layer and the step ferroelectric layer, where each has a different thickness combination. These combinations will be described with reference to the configuration of the multi-level FeFET 100.

In Combination 1, the thickness $T_{ox,right}$ of the right oxide portion 142" of the step oxide layer 142 is greater than the thickness $T_{ox,left}$ of the left oxide portion 142' of the step oxide layer 142. For example, the right oxide portion 142" is thick, and the left oxide portion 142' is thin. The thicknesses $T_{ferrro,left}$ and $T_{ferrro,right}$ of the left and right ferroelectric portions 142' and 142" of the step ferroelectric layer 144 are substantially the same, and the left and right ferroelectric portions 144' and 144" may be thin or thick.

In Combination 2, the thickness $T_{ox,right}$ of the right oxide portion 142" is lesser than the thickness $T_{ox,left}$ of the left oxide portion 142'. For example, the right oxide portion 142" is thin, and the left oxide portion 142' is thick. In this combination, the thicknesses $T_{ferrro,left}$ and $T_{ferrro,right}$ of the left and right ferroelectric portions 144' and 144" are substantially the same, and the left and right ferroelectric portions 144' and 144" may be thin or thick.

In Combination 3, the thickness $T_{ox,right}$ of the right oxide portion 142" is greater than the thickness $T_{ox,left}$ of the left oxide portion 142', as in Combination 1. For example, the right oxide portion 142" is thick, and the left oxide portion 142' is thin. However, the thickness $T_{ferrro,left}$ of the left ferroelectric portion 144' is thin, and the thickness $T_{ferrro,right}$ of the right ferroelectric portion 144" is thick.

In Combination 4, the thickness $T_{ox,right}$ of the right oxide portion 142" is greater than the thickness $T_{ox,left}$ of the left oxide portion 142', as in Combinations 1 and 3. However, the thickness $T_{ferrro,left}$ of the left ferroelectric portion 144' is thick, and the thickness $T_{ferrro,right}$ of the right ferroelectric portion 144" is thin.

In Combination 5, the thickness $T_{ferrro,right}$ of the right ferroelectric portion 144" is greater than the thickness $T_{ferrro,left}$ of the left ferroelectric portion 144'. For example, the right ferroelectric portion 144" is thick, and the left ferroelectric portion 144' is thin. In this combination, the thicknesses $T_{ox,right}$ and $T_{ox,left}$ both are substantially the same, and the left and right oxide portions 142' and 142" may be thin or thick.

In Combination 6, the thickness $T_{ferrro,right}$ of the right ferroelectric portion 144" is lesser than the thickness $T_{ferrro,left}$ of the left ferroelectric portion 144'. For example, the right ferroelectric portion 144" is thin, and the left ferroelectric portion 144' is thick. In this combination, the thicknesses $T_{ox,right}$ and $T_{ox,left}$ are substantially the same, and the left and right oxide portions 142' and 142" may be thin or thick.

In an embodiment, the left and right oxide portions 142' and 142" include high-k material, e.g., hafnium dioxide or zirconium dioxide. The thicknesses thereof vary between about 1 nm to about 5 nm (e.g., 1.5 nm to 4.5 nm) according to implementation. The oxide portion has thickness of about 1.5 nm when it is "thin" and about 3 nm to about 4.5 nm when it is "thick." However, embodiments are not limited to these thicknesses.

In an embodiment, thicknesses of the left and right ferroelectric portions 144' and 144" may vary between about 10 nm to 30 nm. For example, if the ferroelectric portion is "thin," it may have a thickness of about 10 nm. If the ferroelectric portion is "thick," it may have a thickness of about 20 nm to about 30 nm. However, embodiments are not limited to these thicknesses. The thicknesses of the left and right ferroelectric portions may vary depending on a material and a process flow of the left and right ferroelectric portions. For example, a ferroelectric (HfO$_2$) layer may have a thickness of about 7 nm to about 20 nm.

For illustrative convenience, the multi-level FeFET 100 shown in FIG. 1 corresponds to Combination 4 in FIG. 2, but embodiments are not limited thereto.

Figures 3A, 3B:
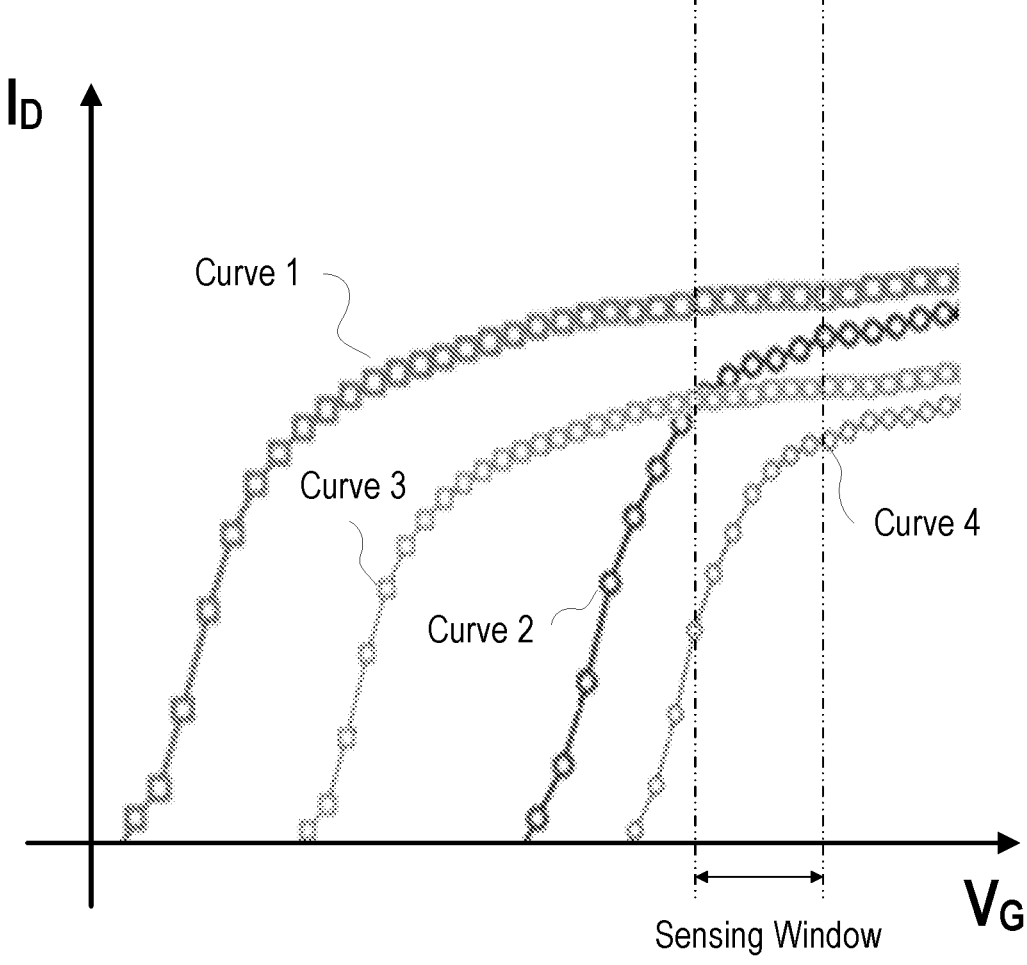
FIG. 3A illustrates polarization states of the multi-level ferroelectric field effect transistor of FIG. 1 according to an embodiment of the present disclosure.
FIG. 3B illustrates voltage to current curves corresponding respectively to polarization states according to an embodiment of the present disclosure.

FIG. 3A illustrates polarization states of the multi-level FeFET 100 of FIG. 1 according to an embodiment of the present disclosure. FIG. 3B illustrates voltage to current curves corresponding respectively to the polarization states of FIG. 3A according to an embodiment of the present disclosure.

In general, a FeFET is used as a type of single transistor non-volatile memory cell in a memory device such as a ferroelectric random access memory (FeRAM) device.

Referring back to FIG. 1, the FeFET 100 includes the ferroelectric layer 144 disposed between the gate electrode 146 and a source-drain conduction region of the FeFET, i.e., the channel region thereof. The ferroelectric layer 144 includes a ferroelectric material that has a nonlinear relationship between an applied electric field and a polarization thereof. Specifically, this relationship of the ferroelectric material has the form of a hysteresis loop.

The dielectric constant of the ferroelectric material is typically much higher than that of a linear dielectric material because of the effects of semi-permanent electric dipoles formed in the ferroelectric material. Therefore, when an external electric field is applied to the ferroelectric material, the dipoles tend to align themselves with a direction of the electric field (referred to as a "field direction") produced by small shifts in positions of atoms and shifts in the distributions of electronic charge in the ferroelectric material. The dipoles retain their polarization state even after application of the external electric field is stopped.

Electrical field polarization in the ferroelectric layer 144 causes the FeFET 100 to retain different states of the FeFET 100, as data, in the absence of any electrical bias.

In the FeFET 100, a program operation is performed by applying an electric field across the ferroelectric layer 144, forcing atoms inside into "up" or "down" orientation (depending on the polarity of the charge), thereby storing binary data "1" or "0."

Binary data "1" or "0" is stored as one of two possible electrical polarizations in each data storage device. For example, referring to FIG. 3A, the binary data "0" may be encoded using a first polarization D (e.g., in the first storage device of the FeFET 100), and the binary data "1" may be encoded using a second polarization U (e.g., in the second storage device of the FeFET 100). The first polarization D is formed when the field direction is formed in a first direction moving from the gate electrode 146 to the channel region. The second polarization U is formed when the field direction is formed in a second direction moving from the channel region to the gate electrode 146, the second direction being opposite to the first direction.

In an embodiment, the FeFET 100 including the first storage device (or left device) and the second storage device (or right device) is a non-volatile memory cell storing 2-bit data.

The 2-bit data stored in the FeFET 100 is determined according to electrical polarizations of the ferroelectric portion of the left device and the ferroelectric portion of the right device as shown in FIG. 3A.

When the ferroelectric portions of the left and the right devices both have the first polarization D, i.e., when the left and the right devices have State 1, the FeFET 100 stores "00." When the ferroelectric portion of the left device has the first polarization D and the ferroelectric portion of the right device has the second polarization U, i.e., when the left and the right devices have State 2, the FeFET 100 stores "01." When the ferroelectric portion of the left device has the second polarization U and the ferroelectric portion of the right device has the first polarization D, i.e., when the left and the right devices have State 3, the FeFET 100 stores "10." When the ferroelectric portions of the left and the right devices both have the second polarization U, i.e., when the left and the right devices have State 4, the FeFET 100 stores "11."

In addition, when the ferroelectric portions of the left and the right devices both have the first polarization D, the FeFET 100 has the highest conductivity. When the ferroelectric portions of the left and the right devices both have the second polarization U, the FeFET 100 has the lowest conductivity. The conductivity when the ferroelectric portion of the left device has the first polarization D and the ferroelectric portion of the right device has the second polarization U may be lower than the conductivity when the ferroelectric portion of the left device has the second polarization U and the ferroelectric portion of the right device has the first polarization D.

In another embodiment, the conductivity when the ferroelectric portion of the left device has the first polarization D and the ferroelectric portion of the right device has the second polarization U may be greater than the conductivity when the ferroelectric portion of the left device has the second polarization U and the ferroelectric portion of the right device has the first polarization D. The conductivity of the polarization states may be changed depending on different device tuning knobs.

Therefore, as shown in FIG. 3B, when the left and the right devices are programmed to have four different states of the electrical polarizations, the FeFET 100 may show four different gate voltage ($V_G$) to drain current ($I_D$) curves (e.g., Curve 1 to Curve 4) corresponding respectively to the four different states State 1 to State 4 of the electrical polarizations shown in FIG. 3A. The gate voltage ($V_G$) may correspond to a voltage applied between the gate terminal G and the source terminal S, and the drain current ($I_D$) may correspond to a current flowing between the drain terminal D and the source terminal S.

Since a threshold voltage is inversely proportional to the conductivity, threshold voltages Vt1 to Vt4 of the four curves (Curve 1 to Curve 4) may be increased in an order of Curve 1, Curve 3, Curve 2, and Curve 4. That is, Vt1<Vt3<Vt2<Vt4. However, embodiments are not limited thereto. In another embodiment, the threshold voltages Vt1 to Vt4 of the four curves (Curve 1 to Curve 4) may be increased in an order of Curve 1, Curve 2, Curve 3, and Curve 4. That is, Vt1<Vt2<Vt3<Vt4.

In a read operation of the FeFET 100, the drain current ID corresponding to 2-bit data stored in the FeFET 100 is sensed in a sensing window, e.g., shown in FIG. 3B, and the 2-bit data stored in the FeFET 100 is read out to be one of "00," "01," "10," and "11" according to a level of the sensed drain current $I_D$.

In an embodiment, a width of the sensing window, i.e., a sensing margin, can be adjusted by controlling one or more of device tuning knobs such as the thicknesses $T_{ox,right}$ and $T_{ox,left}$ of the right and the left oxide portions, the thicknesses $T_{ferro,left}$ and $T_{ferro,right}$ of the left and the right ferroelectric portions, a ratio of the length $L_{g,left}$ to the length $L_{g,right}$, channel implants, metal gate work-functions, and an oxide material.

For example, the Curve 1 and the Curve 2 both have low-Vt for a thin oxide device (i.e., the left device) and thus a threshold voltage Vt is mainly determined by a thick oxide device (i.e., the right device). The Curve 3 and the Curve 4 both have high-Vt for the thin oxide device. The drain current ($I_D$) may be determined by an over-drive voltage ($V_G$-Vt). By changing polarity of the thick oxide device, the over-drive voltage can be varied. The thick oxide device is under-driven in terms of a drain voltage VD that is applied between the drain terminal D and the source terminal S.

FIG. 3B illustrates one example of the curves corresponding to the four different polarization states and the sensing widow that is a horizontal sensing window based on a voltage margin, but embodiments are not limited thereto. In another embodiment, different polarization states may be determined by a vertical sensing window based on a current margin.

Figures 4, 5:
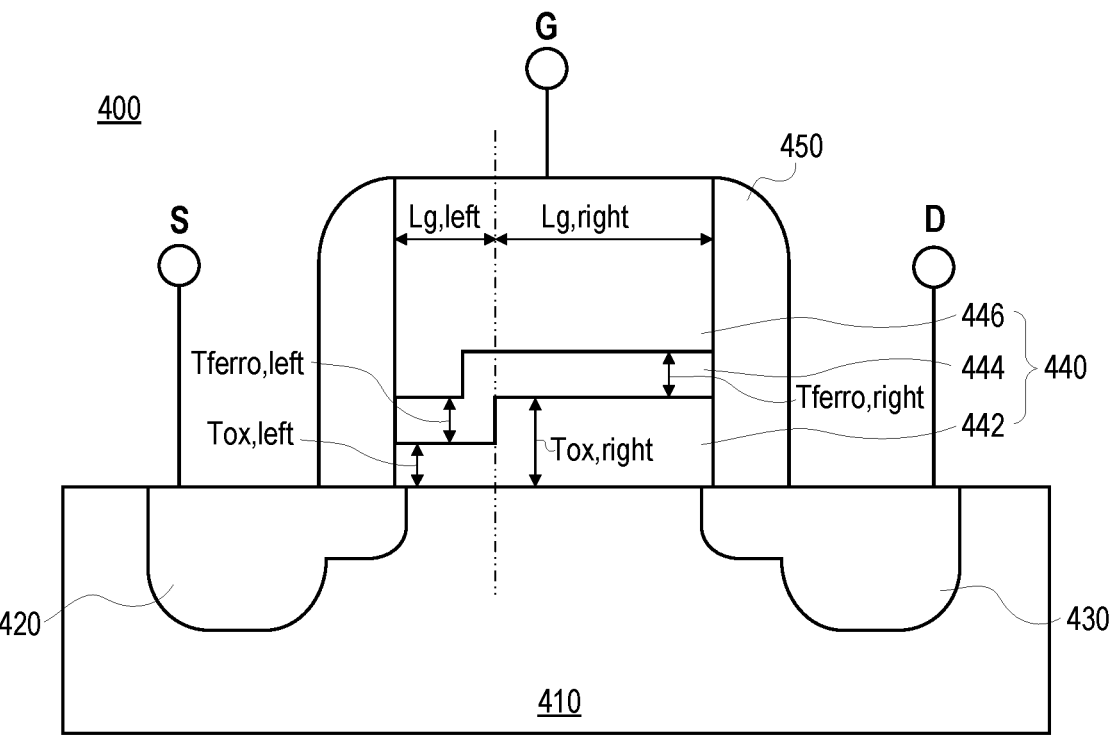
FIG. 4 illustrates a multi-level ferroelectric field effect transistor in a memory device according to another embodiment of the present disclosure.
FIG. 5 illustrates a read operation of a multi-level ferroelectric field effect transistor according to an embodiment of the present disclosure.

FIG. 4 illustrates a multi-level FeFET 400 according to another embodiment of the present disclosure. The multi-level FeFET 400 has a configuration corresponding to Combination 1 shown in FIG. 2.

The FeFET 400 includes a source region 420 and a drain region 430 that are disposed in a substrate 410. The FeFET further includes a gate structure 440 that is disposed over the substate 410 between the source region 420 and the drain region 430. A spacer 450 is disposed on sidewalls of the gate structure 440. The source region 420 is coupled to a source terminal S, the drain region 430 is coupled to a drain terminal D, and the gate structure 440 is coupled to a gate terminal G.

The gate structure 440 includes an oxide layer 442, a ferroelectric layer 444, and a gate electrode 446 that are stacked over a top surface of the substrate 410. The gate electrode 446 includes a left electrode portion and a right electrode portion. The ferroelectric layer 444 includes a left ferroelectric portion and a right ferroelectric portion. The oxide layer 442 includes a left oxide portion and a right oxide portion.

A thickness $T_{ox,right}$ of the right oxide portion is greater than a thickness $T_{ox,left}$ of the left oxide portion. That is, the right oxide portion has a thick thickness, and the left oxide portion has a thin thickness. Thicknesses $T_{ferro,left}$ and $T_{ferro,right}$ of the left and right ferroelectric portions may be substantially the same.

In an embodiment, the left and right oxide portions include high-k material, e.g., hafnium dioxide or zirconium dioxide. The thicknesses thereof vary between about 1 nm to about 5 nm (e.g., 1.5 nm to 4.5 nm) according to implementation. The oxide portion has thickness of about 1.5 nm when it is "thin" and about 3 nm to about 4.5 nm when it is "thick." However, embodiments are not limited to these thicknesses.

In an embodiment, thicknesses of the left and right ferroelectric portions vary between about 10 nm to 30 nm. For example, if the ferroelectric portion is "thin," it has a thickness of about 10 nm. If the ferroelectric portion is "thick," it has a thickness of about 20 to about 30 nm. However, embodiments are not limited to these thicknesses. The thicknesses of the left and right ferroelectric portions may vary depending on a material and a process flow of the left and right ferroelectric portions. For example, a ferroelectric ($HfO_2$) layer may have a thickness of about 7 nm to about 20 nm.

In FIG. 4, the thicknesses $T_{ferro,left}$ and $T_{ferro,right}$ of the left and right ferroelectric portions for the FeFET 400 is provided to be thin.

The gate electrode 446 has the left and right electrode portions that have substantially coplanar upper surfaces. The left and right electrode portions have different lengths. For example, the left electrode portion has a first length $L_{g,left}$ shorter than a second length $L_{g,right}$ of the right electrode portion.

According to an embodiment, in a program operation, in order to write the 2-bit data "00" in the FeFET 400, a supply voltage Vd, e.g., 4V, may be applied to the gate terminal G, and a ground voltage, e.g., 0V, may be applied to the drain terminal D and the source terminal S, so that the left and right ferroelectric portions are programmed to have the first polarization D. Therefore, the 2-bit data "00" corresponds to a polarization state "DD."

In order to write the 2-bit data "01" in the FeFET 400, the supply voltage Vd, e.g., 4V, may be applied to the drain terminal D and the source terminal S, and the ground voltage, e.g., 0V, may be applied to the gate terminal G, so that the left and right ferroelectric portions are programmed to have the polarization U. After that, a low voltage that is lower than the supply voltage, e.g., Vd/2 (2V) or Vd/4 (1V), may be applied to the gate terminal G, and the ground voltage, e.g., 0V, may be applied to the drain terminal D and the source terminal S, so that the left ferroelectric portion is programmed to have the first polarization D and the right ferroelectric portion remains unchanged to have the second polarization U. Therefore, the 2-bit data "01" corresponds to a polarization state "DU."

In order to write the 2-bit data "10" in the FeFET 400, the supply voltage Vd, e.g., 4V, may be applied to the gate terminal G, and the ground voltage, e.g., 0V, may be applied to the drain terminal D and the source terminal S so that the left and right ferroelectric portions are programmed to have the polarization D. After that, the low voltage, e.g., Vd/2 (2V) or Vd/4 (1V), may be applied to the drain terminal D and the source terminal S, and the ground voltage, e.g., 0V, may be applied to the gate terminal G, so that the left ferroelectric portion is programmed to have the second polarization U and the right ferroelectric portion remains unchanged with the first polarization D. Therefore, the 2-bit data "10" corresponds to a polarization state "UD."

In order to write the 2-bit data "11" in the FeFET 400, the supply voltage Vd, e.g., 4V, may be applied to the drain terminal D and the source terminal S, and the ground voltage, e.g., 0V, may be applied to the gate terminal G, so that the left and right ferroelectric portions are programmed to have the second polarization U. Therefore, the 2-bit data "11" corresponds to a polarization state "UU."

When the left and the right devices are programmed to have one of the four different states of the electrical polarizations, the FeFET 400 would have a corresponding gate voltage ($V_G$) to drain current ($I_D$) curves (e.g., one of Curve 1 to Curve 4) as illustrated in FIG. 3B. The curves Curve 1 to Curve 4 may correspond respectively to the four different binary states "00," "01," "10," and "11."

A threshold voltage of a transistor is inversely proportional to the conductivity, and thus threshold voltages Vt1 to Vt4 of the four curves (e.g., Curve 1 to Curve 4) increase in an order of Curve 1, Curve 3, Curve 2, and Curve 4 (Vt1<Vt3<Vt2<Vt4) or in an order of Curve 1, Curve 2, Curve 3, and Curve 4 (Vt1<Vt2<Vt3<Vt4) according to an embodiment.

According to an embodiment, in a read operation, when a read voltage is applied to the FeFET 400, the drain current $I_D$ is sensed in a sensing window as shown in FIG. 3B, and the 2-bit data stored in the FeFET 400 is read out to be one of "00," "01," "10," and "11" according to a level of the sensed drain current $I_D$.

Referring to FIG. 5, when the left and right ferroelectric portions of the left device and the right device both have the first polarization D, the FeFET 400 has the highest conductivity, and thus the sensed current has the highest level (High++). When the ferroelectric portions of the left device and the right device both have the first polarization U, the FeFET 400 has the lowest conductivity, and thus the sensed current has the lowest level (Low−−).

Since the thickness $T_{ox,left}$ of the left oxide portion is lesser than the thickness $T_{ox,right}$ of the right oxide portion, the sensed current when the ferroelectric portion of the left device has the first polarization D and the ferroelectric portion of the right device has the second polarization U may have a level (High) higher than a level (Low) of the sensed current when the ferroelectric portion of the left device has the second polarization U and the ferroelectric portion of the right device has the first polarization D in the sensing window. However, embodiments are not limited thereto.

In another embodiment, the sensed current when the ferroelectric portion of the left device has the first polarization D and the ferroelectric portion of the right device has the second polarization U may have a level (Low) lower than a level (High) of the sensed current when the ferroelectric portion of the left device has the second polarization U and the ferroelectric portion of the right device has the first polarization D in the sensing window. Since the conductivity of the polarization states may be changed depending on different device tuning knobs, the sensed current may be also changed depending on the different device tuning knobs.

In the above description, the program operation and the read operation are described based on the multi-level FeFET 400 of FIG. 4. However, such operations may be applied to another multi-level FeFET, e.g., the multi-level FeFET 100 shown in FIG. 1. In other embodiments, a program operation and a read operation of a multi-level FeFET may be performed in different ways.

Figure 6:
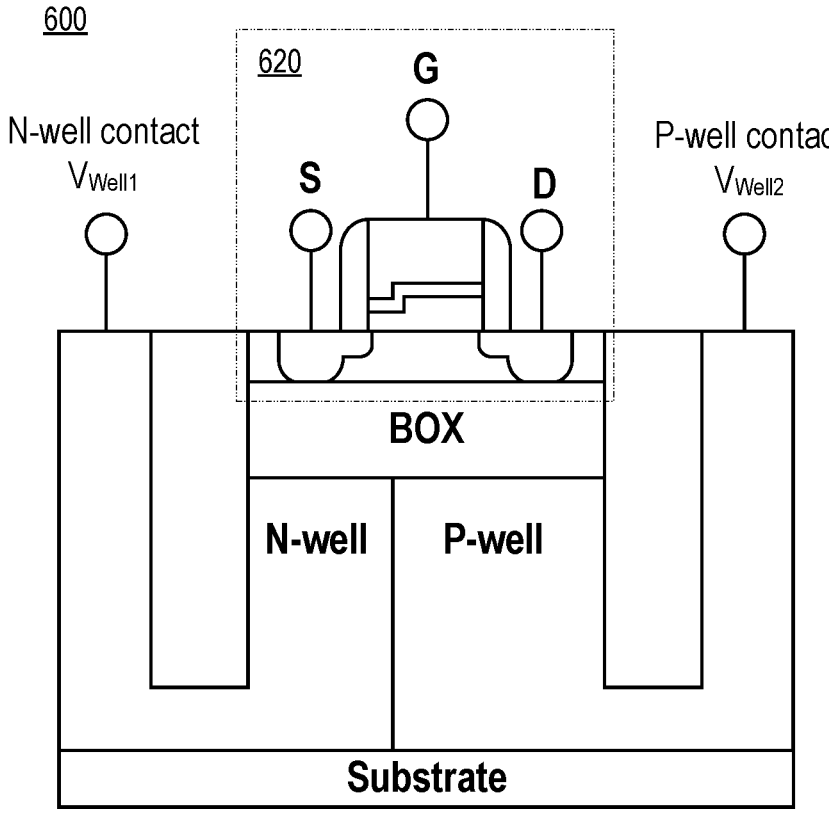
FIG. 6 illustrates a semiconductor device according to an embodiment of the present disclosure.

FIG. 6 illustrates a semiconductor device 600 according to an embodiment of the present disclosure. The semiconductor device 600 includes a multi-level FeFET 620 to which partially depleted silicon on insulator (PDSOI) technology is applied, thereby defining a FeFETSOI device.

The semiconductor device 600 may include two different implant regions, e.g., an N-type well region (N-well) and a P-type well region (P-well), which are laterally disposed over a substrate, a buried oxide layer (BOX) disposed over the N-well and the P-well, and a multi-level FeFET structure 620 that may correspond to the multi-level FeFET 400 of FIG. 4 and is disposed over the BOX. In this embodiment, the N-well is on a source side of the semiconductor device 600 and disposed under a left device of the multi-level FeFET structure 620, and the P-well is on a drain side of the semiconductor device 600 and disposed under a right device of the multi-level FeFET structure 620.

The semiconductor device 600 may further include an N-well contact and a P-well contract to supply a first well voltage $V_{Well1}$ and a second well voltage $V_{Well2}$ to the N-well and the P-well, respectively. In the semiconductor device 600, by applying body-biasing through the N-well contact and the P-well contract to the N-well and the P-well, it is possible to further adjust threshold voltages of the left device and the right device individually in addition to the embodiment of FIG. 4 in which the threshold voltage of the multi-level FeFET 400 is controlled by adjusting at least one of device knobs such as the thicknesses $T_{ox,right}$ and $T_{ox,left}$ of the right and the left oxide portions, the thicknesses $T_{ferrro,left}$ and $T_{ferrro,right}$ of the left and the right ferroelectric portions, a ratio of the length $L_{g,left}$ to the length $L_{g,right}$, channel implants, metal gate work-functions, and the oxide material.

In an embodiment, when forward back-gate biasing is applied to the semiconductor device 600, a threshold voltage of the semiconductor device 600 becomes lower. On the other hand, when reverse back-gate biasing is applied to the semiconductor device 600, the threshold voltage of the semiconductor device 600 becomes higher.

In another embodiment, back-gate biasing may be separately applied to the left and right devices with splitted back-gates. As shown in FIG. 6, the left device with the N-well may be forward-biased to further lower the threshold voltage while the right device with the P-well is reverse-biased to increase its threshold voltage.

In FIG. 6, the semiconductor device 600 provides the multi-level FeFET applied to a PDSOI that includes the N-well and the P-well. However, embodiments are not limited thereto. In another embodiment, the multi-level FeFET may be applied to a fully depleted silicon on insulator (FDSOI) including one well region such as an N-type well region or a P-type well region.

In addition, in FIG. 6, the multi-level FeFET structure 620 corresponding to the multi-level FeFET 400 of FIG. 4 is disposed on the PDSOI, but, in another embodiment, a multi-level FeFET corresponding to any one of combinations of a step oxide layer and a step ferroelectric layer, e.g., one of the six combinations shown in FIG. 2, may be applied to the FDSOI or PDSOI.

Figure 7A:
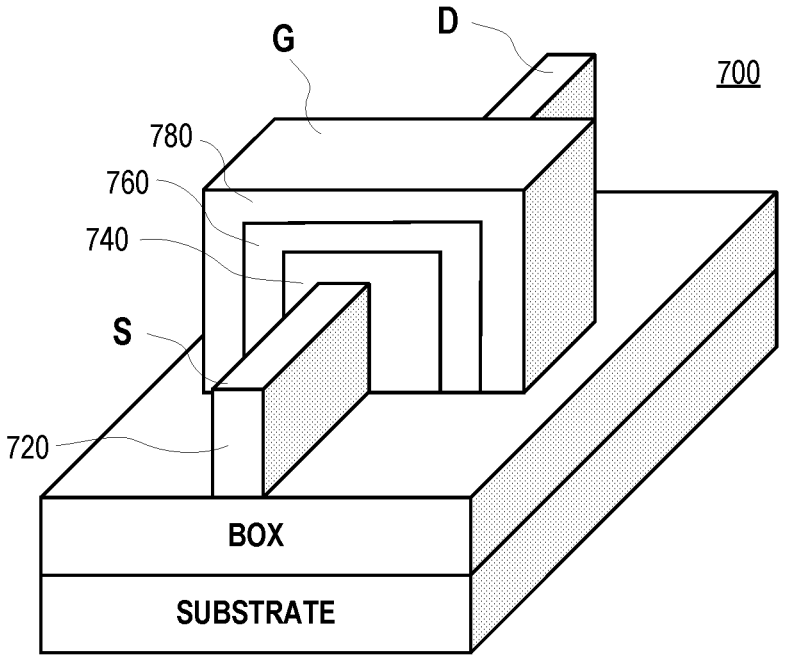
FIGS. 7A and 7B illustrate a fin field effect transistor (FinFET) according to an embodiment of the present disclosure.
Figure 7B:
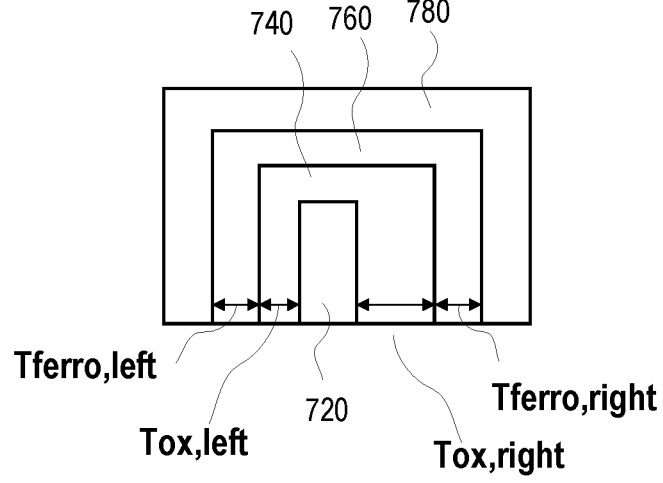

FIGS. 7A and 7B illustrate a fin field effect transistor (FinFET) 700 according to an embodiment of the present disclosure. FIG. 7A is a perspective view of the FinFET 700, and FIG. 7B is a cross-sectional view of a gate structure (G) of the FinFET 700.

The FinFET 700 includes the gate structure (G) disposed between a source region (S) and a drain region (D). The gate structure (G) includes a fin 720, an oxide layer 740, a ferroelectric layer 760, and a gate electrode 780. The oxide layer 740, the ferroelectric layer 760, and the gate electrode 780 are formed to sequentially cover the fin 720 over a buried oxide layer (BOX) formed on a substrate.

Referring to FIG. 7B, the oxide layer 740 includes a left oxide portion and a right oxide portion with respect to the fin 720. The right oxide portion has a thickness $T_{ox,right}$ greater than a thickness $T_{ox,left}$ of the left oxide portion. The thickness $T_{ox,right}$ may be two or three times the thickness $T_{ox,left}$. However, embodiments are not limited to these thicknesses.

The ferroelectric layer 760 includes a left ferroelectric portion and a right ferroelectric portion that correspond respectively to the left and right oxide portions. The left ferroelectric portion has a thickness $T_{ferro,left}$ that is substantially the same as a thickness $T_{ferro,right}$ of the right ferroelectric portion. However, embodiments are not limited to these thicknesses. In another embodiment, configurations of the oxide layer 740 and the ferroelectric layer 760 may correspond to one of the six combinations of FIG. 2.

Program and read operations of the FinFET 700 may be understood with reference to the program and read operations of the FeFET 400 of FIG. 4. Therefore, for illustrative convenience, detailed descriptions thereof are omitted.

Figure 8:
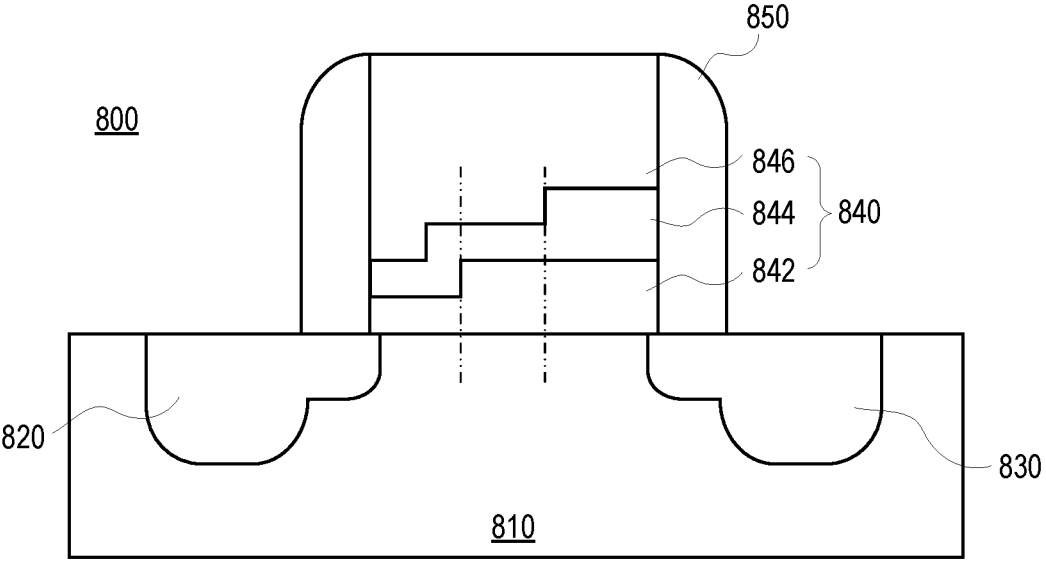
FIG. 8 illustrates a multi-level ferroelectric field effect transistor in a memory device according to yet another embodiment of the present disclosure.

FIG. 8 illustrates a multi-level FeFET 800 according to yet another embodiment of the present disclosure. The multi-level FeFET 800 stores multi-bit data, e.g., 3-bit data.

The FeFET 800 includes a gate structure 840 that is disposed over a substrate 810 between a source region 820 and a drain region 830. The gate structure 840 includes an oxide layer 842, a ferroelectric layer 844, and a gate electrode 846 that are sequentially stacked over the substrate 810.

The oxide layer 842 includes three oxide portions laterally disposed over the substrate 810, e.g., first to third oxide portions, at least two of the first to third oxide portions having the same or different thicknesses. The ferroelectric layer 844 includes three ferroelectric portions, e.g., first to third ferroelectric portions corresponding respectively to the first to third oxide portions, at least two of the first to third ferroelectric portions having the same or different thicknesses. The gate electrode 846 may include three electrode portions, e.g., first to third electrode portions corresponding respectively to the first to third ferroelectric portions.

Therefore, the gate structure 840 may include a first gate structure, a second gate structure, and a third gate structure. The first gate structure includes the first electrode portion, the first ferroelectric portion, and the first oxide portion, the second gate structure includes the second electrode portion, the second ferroelectric portion, and the second oxide portion, and the third gate structure includes the third electrode portion, the third ferroelectric portion, and the third oxide portion.

The FeFET 800 may include a first storage device including the first gate structure, a second storage device including the second gate structure, and a third storage device including the third gate structure. Each of the first to third storage devices stores 1-bit data, so that the FeFET 800 stores the 3-bit data.

In a similar manner to the program operation described above, in a program operation, the first to third storage devices are programmed to have 8 different states of electrical polarizations, and thus the FeFET 800 shows 8 different gate voltage to drain current curves Curve 1 to Curve 8. The curves Curve 1 to Curve 8 correspond respectively to 8 different binary states, e.g., 3-bit data "000," "001," "010," "011," "100," "101," "110," and "111."

In an embodiment, in a read operation, sensed currents corresponding respectively to the curves Curve 1 to Curve 8 may be gradually decreased as going from the curve Curve 1 to the curve Curve 8.

FIG. 8 shows the multi-level FeFET 800 that includes the first gate structure, the second gate structure, and the third gate structure to store 3-bit data. However, embodiments are not limited thereto.

In another embodiment, a multi-level FeFET may be implemented to store more than 3-bit data. In this case, in the multi-level FeFET, an oxide layer may include four or more oxide portions laterally disposed over a substrate, at least two of the four or more oxide portions having the same or different thicknesses, and a ferroelectric layer may include four or more ferroelectric portions corresponding respectively to the four or more oxide portions, at least two of the four or more ferroelectric portions having the same or different thicknesses.

As described above, according to the embodiments of the present disclosure, by employing the step oxide layer and the step ferroelectric layer in the ferroelectric memory device, it is possible to implement the ferroelectric memory device storing multi-bit data and thus to increase storage capacity and reduce bit-cost per area of the ferroelectric memory device.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A ferroelectric memory device, comprising:
a substrate including a channel region, a source region, and a drain region; and
a gate structure disposed over the substrate,
wherein the gate structure includes:
a gate electrode including a plurality of electrode portions arranged in a first direction parallel to a top surface of the substrate;
an oxide layer including a plurality of oxide portions corresponding respectively to the plurality of electrode portions, the plurality of oxide portions being disposed on and in direct contact with the channel region; and
a ferroelectric layer disposed between the gate electrode and the oxide layer along a second direction perpendicular to the first direction and including a plurality of ferroelectric portions corresponding respectively to the plurality of oxide portions, the plurality of ferroelectric portions being disposed in direct contact with each other,
wherein at least one of the plurality of oxide portions and at least one of the plurality of ferroelectric portions have different thicknesses along the second direction.

2. The ferroelectric memory device of claim 1, wherein:
the gate electrode includes a first electrode portion and a second electrode portion disposed over the substrate,
the oxide layer includes a first oxide portion and a second oxide portion, and
the ferroelectric layer includes a first ferroelectric portion and a second ferroelectric portion.

3. The ferroelectric memory device of claim 2, wherein the first electrode portion, the first oxide portion, the first ferroelectric portion are aligned along the second direction, and
each of the first electrode portion, the first oxide portion, the first ferroelectric portion has substantially the same length along the first direction.

4. The ferroelectric memory device of claim 2, wherein the first electrode portion and the second electrode portion have a first length and a second length, respectively, in the first direction, the first length being shorter than the second length.

5. The ferroelectric memory device of claim 2, wherein the first oxide portion has a first thickness, and the second oxide portion has a second thickness, the first thickness being lesser than the second thickness, and
wherein the first ferroelectric portion has a third thickness, and the second ferroelectric portion has a fourth thickness, the third thickness being greater than the fourth thickness.

6. The ferroelectric memory device of claim 5, wherein the second thickness is greater than that of the first thickness, and the third thickness is greater than that of the fourth thickness.

7. The ferroelectric memory device of claim 2, wherein the first oxide portion has a first thickness, and the second oxide portion has a second thickness, the second thickness being greater than the first thickness, and
wherein the first ferroelectric portion has a third thickness, and the second ferroelectric portion has a fourth thickness, the third thickness being substantially the same as the fourth thickness.

8. The ferroelectric memory device of claim 2, wherein the gate structure includes a first gate portion and a second gate portion, the first gate portion including the first electrode portion, the first ferroelectric portion, and the first oxide portion, the second gate portion including the second electrode portion, the second ferroelectric portion, and the second oxide portion,
wherein the ferroelectric memory device includes a first storage device including the first gate portion and a second storage device including the second gate portion, and
wherein the first and the second storage devices are part of the same ferroelectric field effect transistor (FeFET), each storage device being configured to store 1-bit data, so that the FeFET is configured to store 2-bit data.

9. The ferroelectric memory device of claim 1, wherein:
the gate electrode includes a first electrode portion, a second electrode portion, and a third electrode portion,
the oxide layer includes a first oxide portion, a second oxide portion, and a third oxide portion, at least two of the first to third oxide portions having different thicknesses, and
the ferroelectric layer includes a first ferroelectric portion, a second ferroelectric portion, and a third ferroelectric portion, at least two of the first to third ferroelectric portions having different thicknesses.

10. The ferroelectric memory device of claim 9, wherein the first oxide portion has a first thickness, the second oxide portion has a second thickness, and the third oxide portion has a third thickness, the second and the third thicknesses being substantially the same, the first thickness being lesser than each of the second the third thicknesses, and
wherein the first ferroelectric portion has a fourth thickness, the second ferroelectric portion has a fifth thickness, and the third ferroelectric portion has a sixth thickness, the fourth and the fifth thicknesses being substantially the same, the sixth thickness being greater than each of the fourth and the fifth thicknesses.

11. The ferroelectric memory device of claim 10, wherein each of the second and the third thicknesses is at least about twice that of the first thickness, and the sixth thickness is at least twice that of the fourth and the fifth thicknesses.

12. The ferroelectric memory device of claim 9, wherein the gate structure includes a first gate portion, a second gate portion, and a third gate portion, the first gate portion including the first electrode portion, the first ferroelectric portion, and the first oxide portion, the second gate portion including the second electrode portion, the second ferroelectric portion, and the second oxide portion, and the third gate portion including the third electrode portion, the third ferroelectric portion, and the third oxide portion,
wherein the ferroelectric memory device includes a first storage device including the first gate portion, a second storage device including the second gate portion, and a third storage device including the third gate portion, and
wherein the first, the second, and the third storage devices are part of the same ferroelectric field effect transistor (FeFET), each storage device being configured to store 1-bit data, so that the FeFET is configured to store 3-bit data.

13. The ferroelectric memory device of claim 2, further comprising:
a first well region disposed under the source region and the first ferroelectric portion;
a second well region disposed under the drain region and the second ferroelectric portion;
a first well contact to apply a first voltage to the first well region; and a second well contact to apply a second voltage to the second well region, wherein the first well region has a first conductive type and the second well region has a second conductive type different from the first conductive type.

14. The ferroelectric memory device of claim 13, wherein the first conductive type is N-type, and the second conductive type is P-type.

15. A method of operating a ferroelectric memory device, wherein the ferroelectric memory device comprises:

a substrate including a channel region, a source region, and a drain region; and a gate structure disposed over the substrate, wherein the gate structure includes:

a gate electrode including a plurality of electrode portions arranged in a first direction parallel to a top surface of the substrate;

an oxide layer including a plurality of oxide portions corresponding respectively to the plurality of electrode portions, the plurality of oxide portions being disposed on and in direct contact with the channel region; and a ferroelectric layer disposed between the gate electrode and the oxide layer along a second direction perpendicular to the first direction and including a plurality of ferroelectric portions corresponding respectively to the plurality of oxide portions, the plurality of ferroelectric portions being disposed in direct contact with each other, wherein at least one of the plurality of oxide portions and at least one of the plurality of ferroelectric portions have different thicknesses along the second direction, and wherein the method comprises:

in order to write a first state, applying a supply voltage to the gate structure and applying a ground voltage to the drain region and the source region;

in order to write a second state, applying the supply voltage to the drain region and the source region and applying the ground voltage to the gate structure, and further applying a low voltage that is lower than the supply voltage to the gate structure and applying the ground voltage to the drain region and the source region;

in order to write a third state, applying the supply voltage to the gate structure and applying the ground voltage to the drain region and the source region, and further applying the low voltage to the drain region and the source region and applying the ground voltage to the gate structure; and in order to write a fourth state, applying the supply voltage to the drain region and the source region and applying the ground voltage to the gate structure.

16. The method of claim 15, wherein the low voltage has a level corresponding to one of a half or a quarter of a level of the supply voltage.

17. A memory device including a ferroelectric field effect transistor (FeFET), the FeFET comprising:

a substrate including a channel region, a source region, and a drain region; and a gate structure disposed over the substrate, wherein the gate structure includes:

an oxide layer disposed on and in direct contact with the channel region, the oxide layer including a first oxide portion and a second oxide portion;

a ferroelectric layer provided over the oxide layer, the ferroelectric layer including a first ferroelectric portion and a second ferroelectric portion that are disposed in direct contact with each other; and a gate electrode provided over the ferroelectric layer, the gate electrode including a first gate portion and a second gate portion, wherein the first gate portion, the first ferroelectric portion, and the first oxide portion define a first storage device that is configured to store 1-bit data, wherein the second gate portion, the second ferroelectric portion, and the second oxide portion define a second storage device that is configured to store 1-bit data, and wherein the FeFET includes a dielectric structure including the oxide layer and the ferroelectric layer, the dielectric structure being a step dielectric structure.

18. The memory device of claim 17, wherein the oxide layer has a step structure, or the ferroelectric layer has a step structure, or the oxide and the ferroelectric layers have the step structures.

19. The memory device of claim 17, wherein the dielectric structure has two or more steps.

\* \* \* \* \*